United States Patent
Kim et al.

(10) Patent No.: US 11,076,481 B2
(45) Date of Patent: Jul. 27, 2021

(54) STRETCHABLE SUBSTRATE, METHOD FOR MANUFACTURING STRETCHABLE SUBSTRATE, DEVICE FOR MANUFACTURING STRETCHABLE SUBSTRATE STRUCTURE, AND METHOD FOR MANUFACTURING STRETCHABLE SUBSTRATE STRUCTURE

(71) Applicant: Korea University Research and Business Foundation, Sejong Campus, Sejong-si (KR)

(72) Inventors: Sang Il Kim, Yongin-si (KR); Mun Pyo Hong, Seongnam-si (KR); Bo Sung Kim, Seoul (KR); Ho Won Yoon, Seoul (KR); Kyung Uk Ha, Busan (KR); Yun O Im, Seoul (KR)

(73) Assignee: Korea University Research and Business Foundation, Sejong Campus, Sejong-si (KR)

( * ) Notice: Subject to any disclaimer, the term of this patent is extended or adjusted under 35 U.S.C. 154(b) by 0 days.

(21) Appl. No.: 16/738,648

(22) Filed: Jan. 9, 2020

(65) Prior Publication Data
US 2020/0229301 A1 Jul. 16, 2020

Related U.S. Application Data

(63) Continuation of application No. PCT/KR2018/007744, filed on Jul. 9, 2018.

(30) Foreign Application Priority Data

Jul. 10, 2017 (KR) .......................... 10-2017-0087157
Jul. 10, 2017 (KR) .......................... 10-2017-0087162

(51) Int. Cl.
H05K 1/02 (2006.01)
C08J 3/28 (2006.01)
H05K 3/12 (2006.01)

(52) U.S. Cl.
CPC .............. *H05K 1/0283* (2013.01); *C08J 3/28* (2013.01); *H05K 3/1283* (2013.01); *H05K 2201/0187* (2013.01)

(58) Field of Classification Search
CPC ...... H05K 1/02; H05K 1/0283; H05K 3/1283; H05K 2201/0187; C08J 3/28
(Continued)

(56) References Cited

FOREIGN PATENT DOCUMENTS

KR 10-2012-0024364 A 3/2012
KR 10-2013-0128439 A 11/2013
(Continued)

OTHER PUBLICATIONS

Machine Translation of Song et al. (Korean Patent Publication No. 2016-0070226), Jun. 20, 2016 (Year: 2016).*
(Continued)

*Primary Examiner* — Tremesha S Willis
(74) *Attorney, Agent, or Firm* — Sughrue Mion, PLLC

(57) ABSTRACT

A stretchable substrate according to an embodiment of the present invention comprises a first modulus region which has a first modulus, a second modulus region which is located in a plane direction with respect to the first modulus region and has a second modulus higher than the first modulus, and a third modulus region which is located between the first modulus region and the second modulus region and has an interface modulus which gradually changes between the first modulus and the second modulus, wherein the interface modulus of the third modulus region may be constant in the thickness direction thereof.

8 Claims, 14 Drawing Sheets

(58) Field of Classification Search
USPC .......................................................... 174/254
See application file for complete search history.

(56) References Cited

FOREIGN PATENT DOCUMENTS

| KR | 10-2015-0020922 A | 2/2015 |
| KR | 10-2015-0077899 A | 7/2015 |
| KR | 10-2015-0087218 A | 7/2015 |
| KR | 10-2016-0042288 A | 4/2016 |
| KR | 10-2016-0070226 A | 6/2016 |
| KR | 10-1647023 B1 | 8/2016 |
| WO | 2011/124898 A1 | 10/2011 |

OTHER PUBLICATIONS

International Search Report for PCT/KR2018/007744 dated Oct. 15, 2018 [PCT/ISA/210].

* cited by examiner

[Fig. 1]
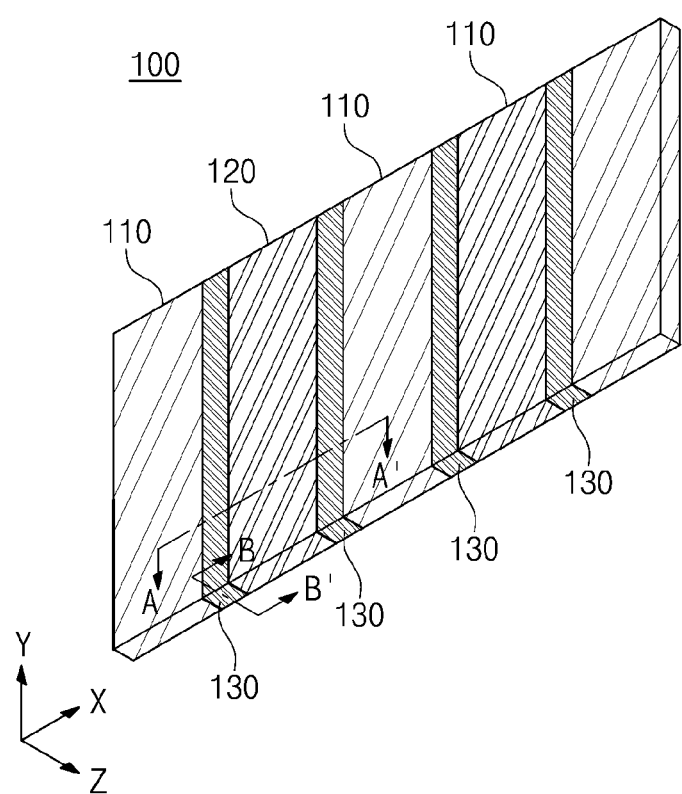

【Fig. 2A】
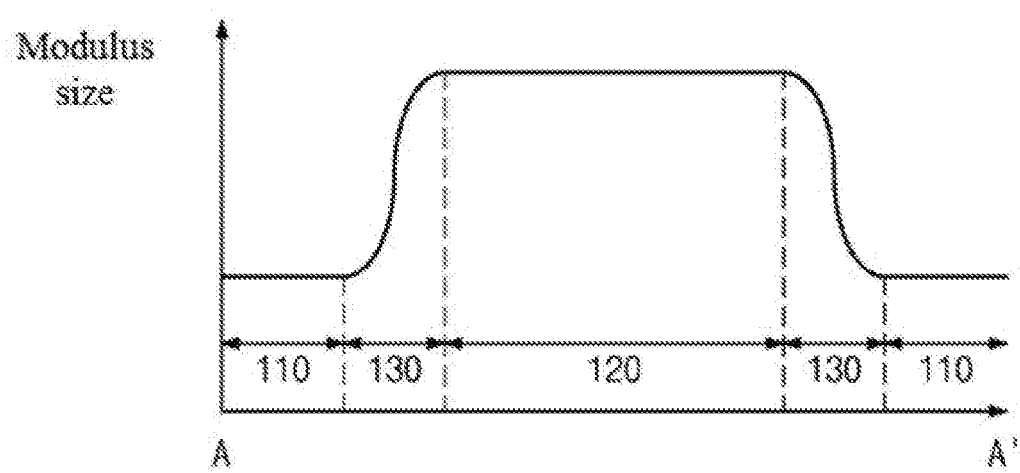
【Fig. 2B】
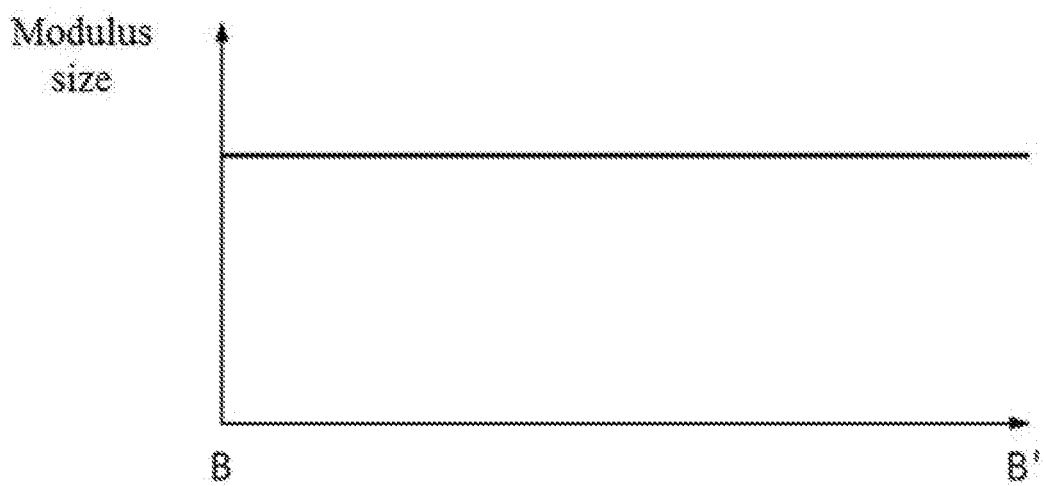

[Fig. 3]
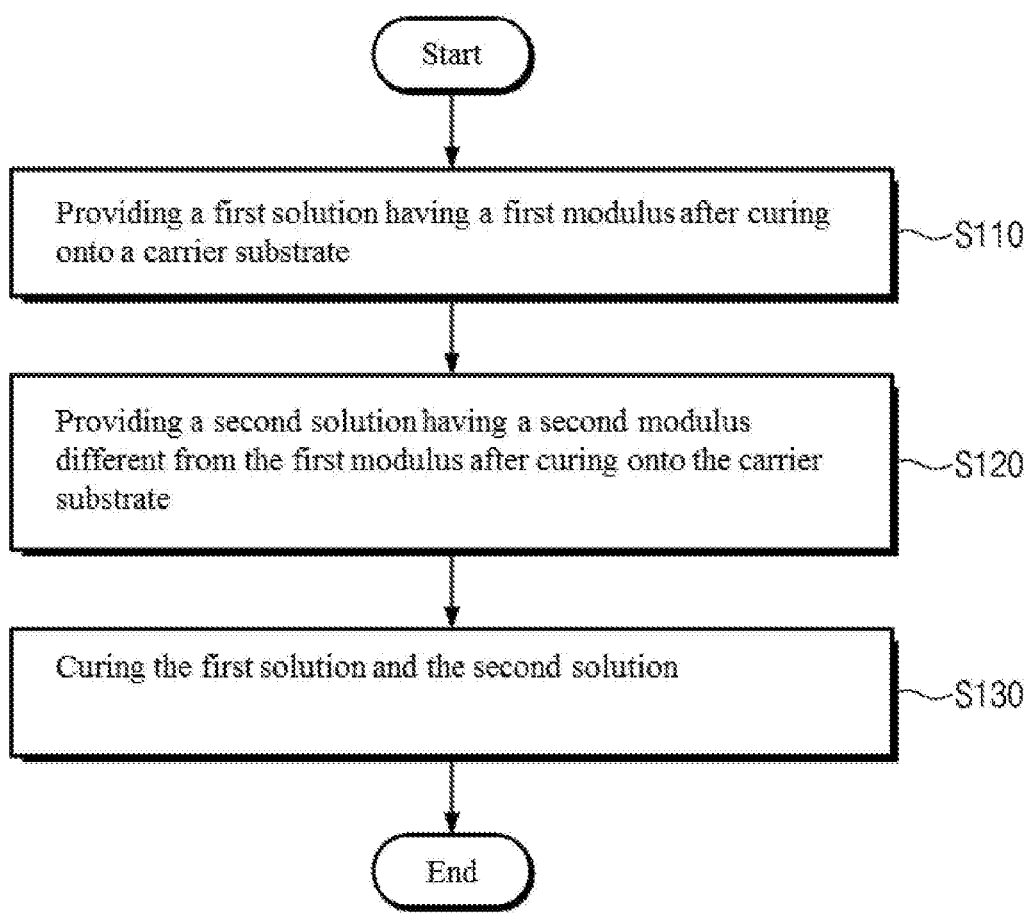

[Fig. 4]
S110
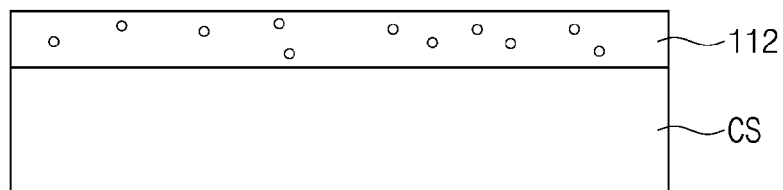

[Fig. 5A]
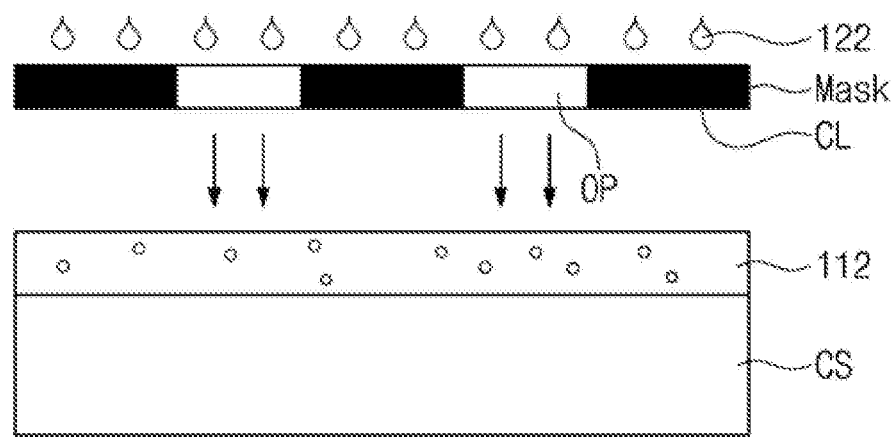
[Fig. 5B]
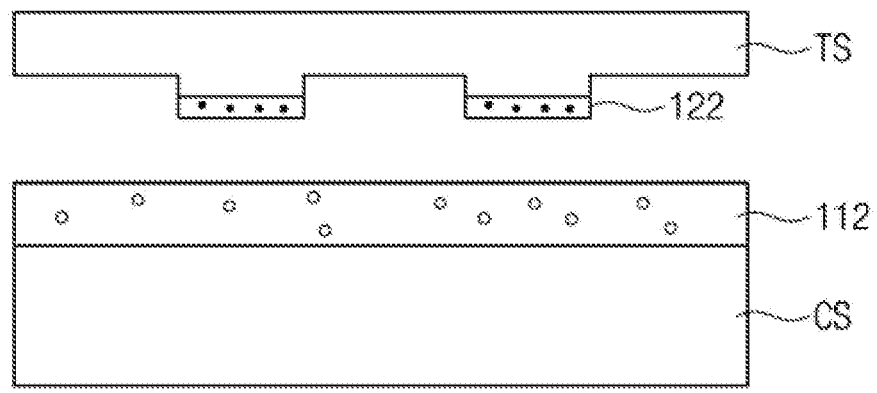

[Fig. 6]
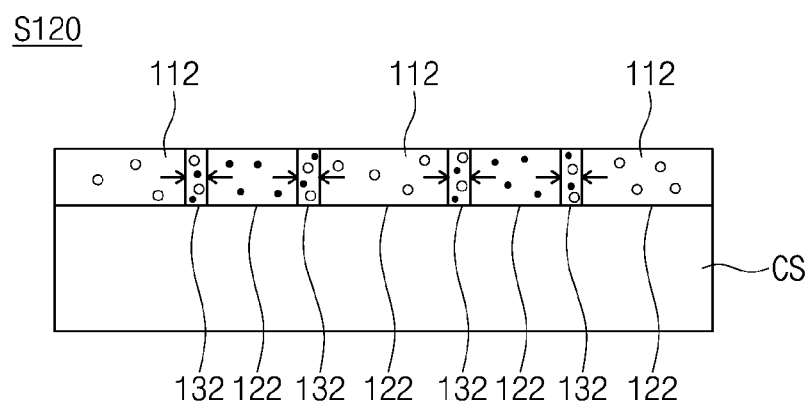

[Fig. 7]
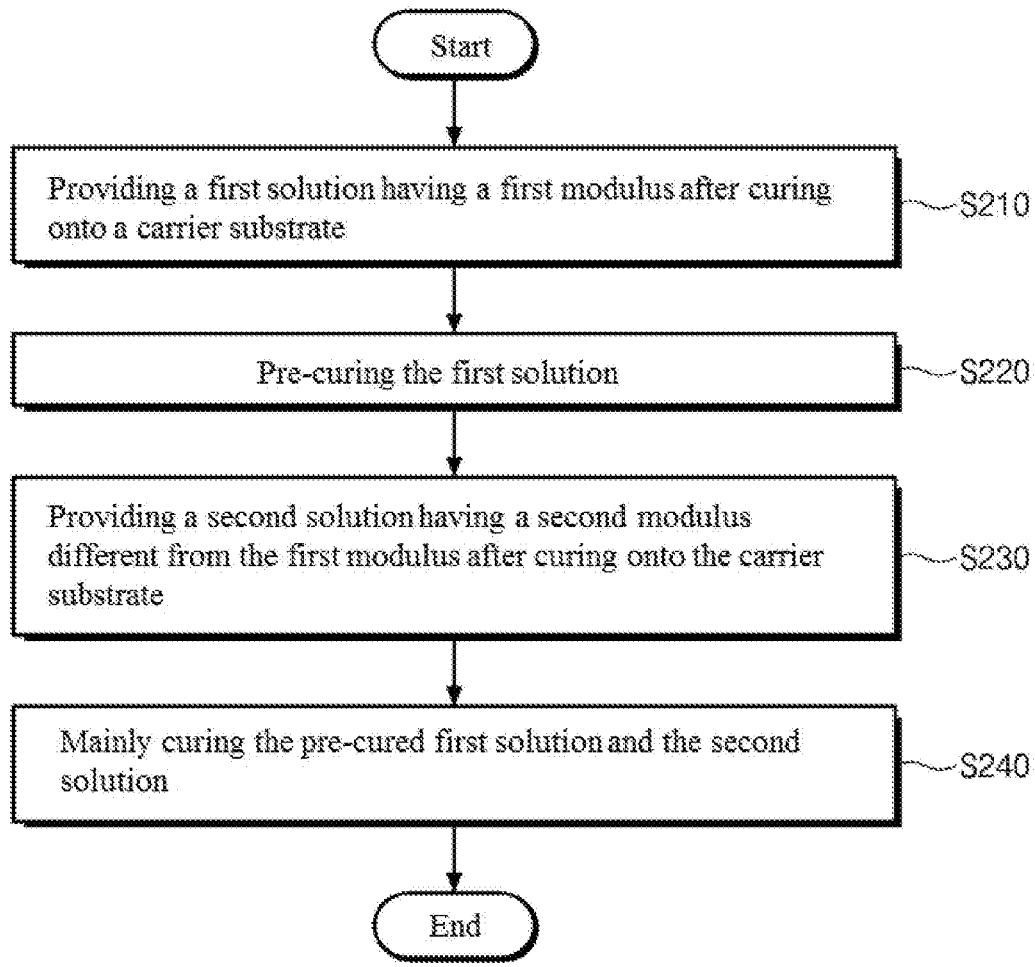

[Fig. 8]
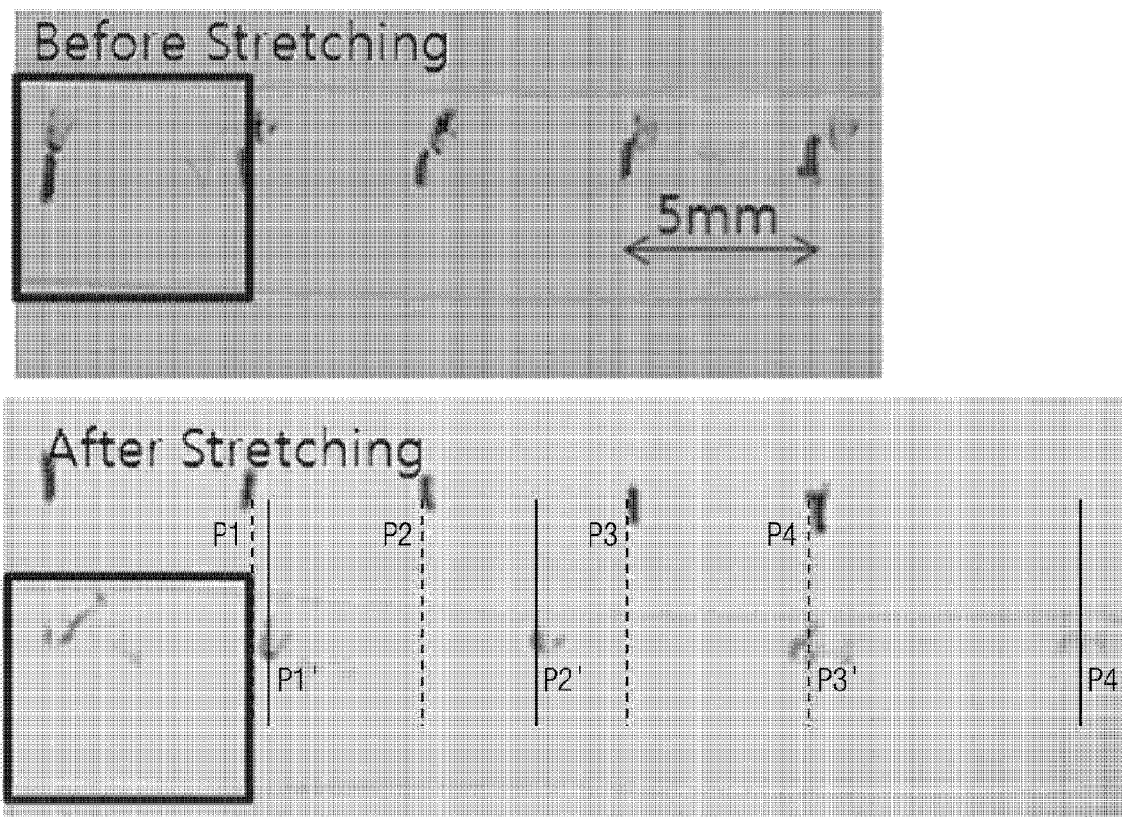

[Fig. 9A]
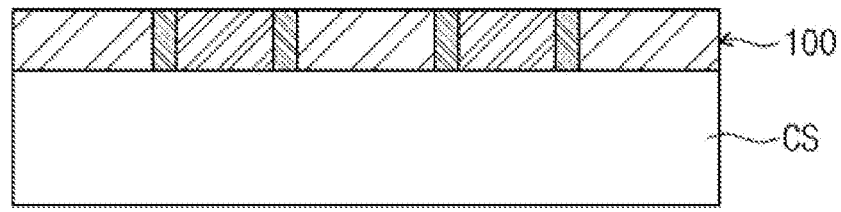
[Fig. 9B]
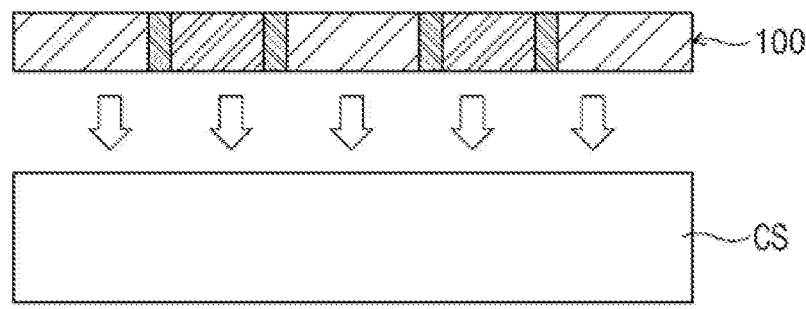
[Fig. 9C]
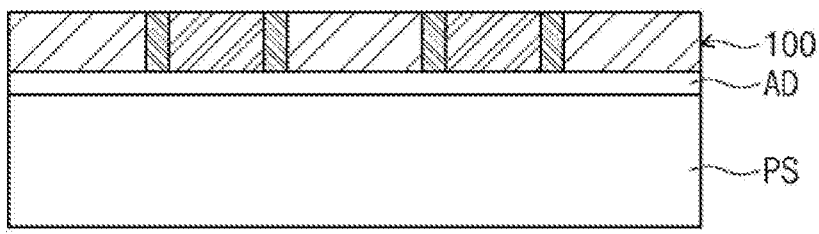
[Fig. 9D]
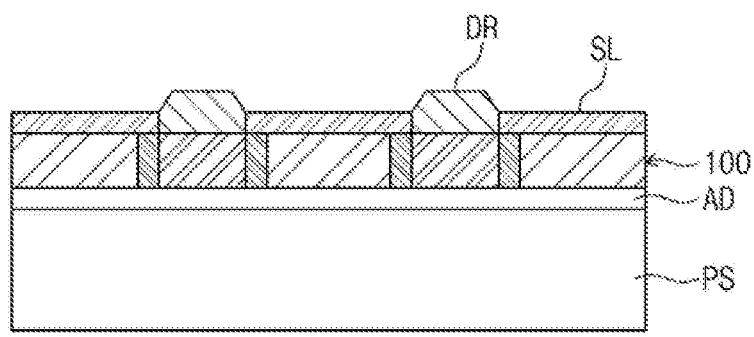

[Fig. 10]
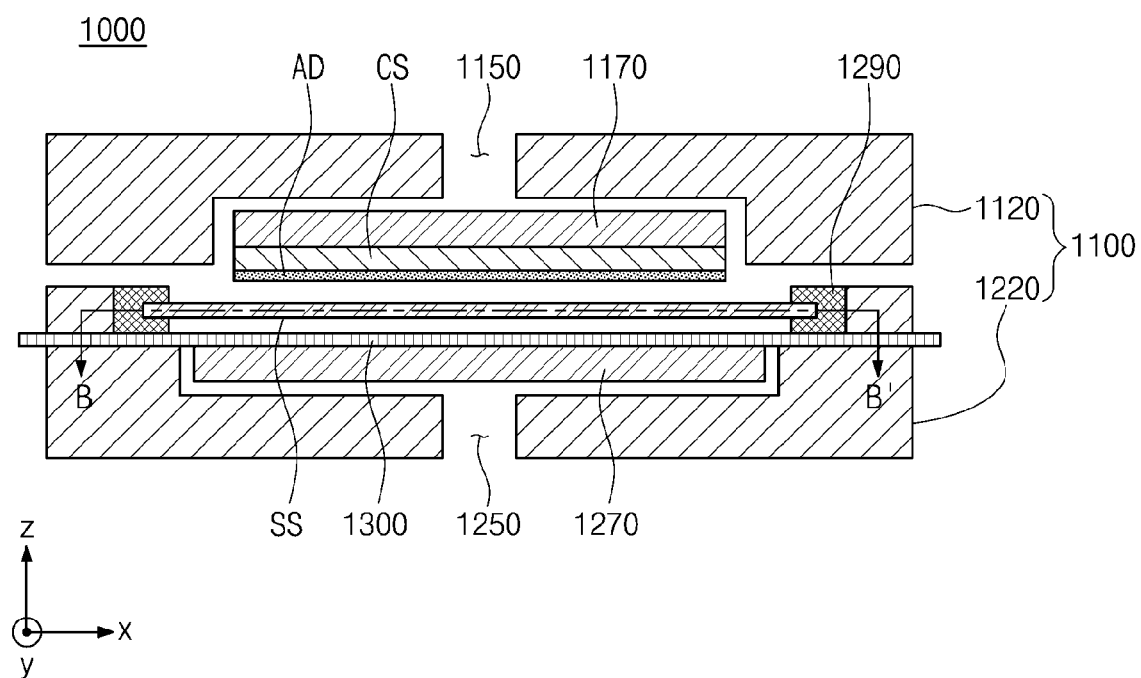

[Fig. 11]
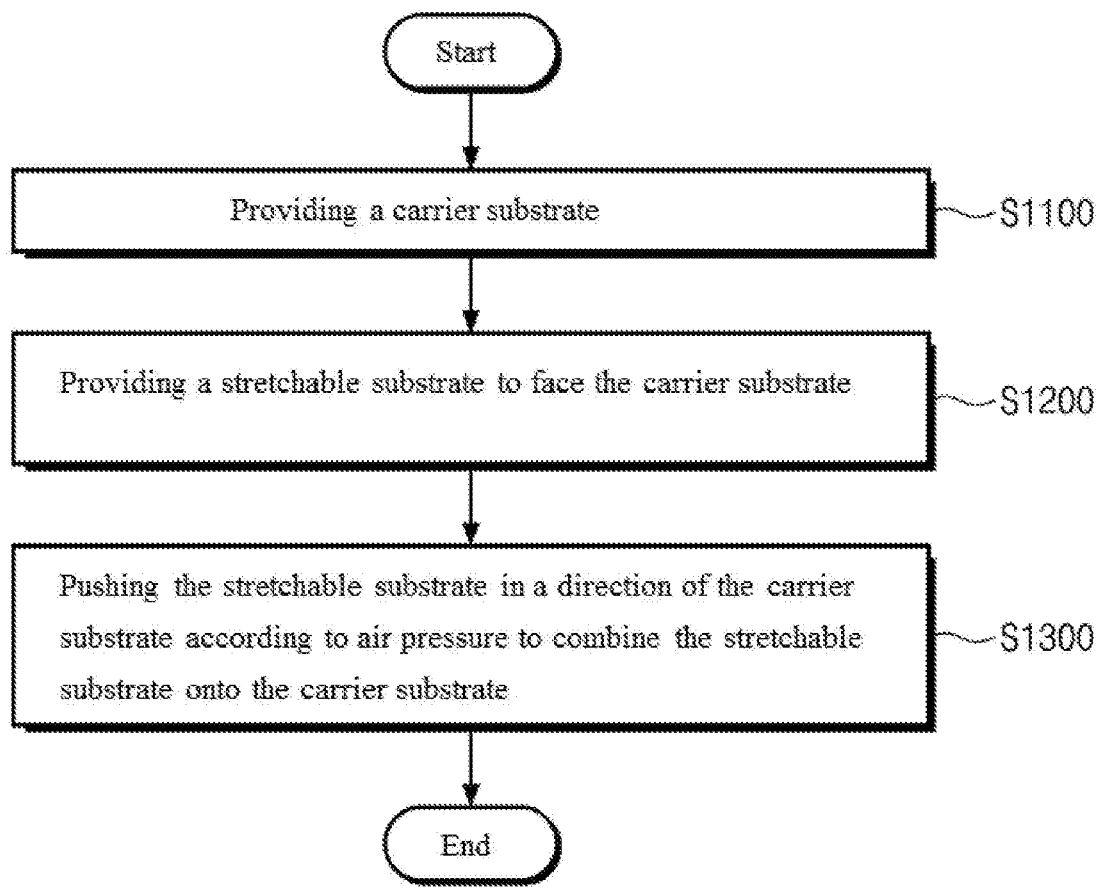

[Fig. 12]
S1100
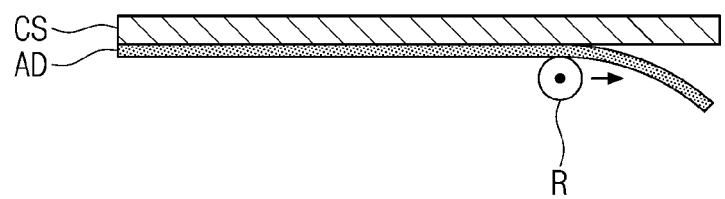

[Fig. 13A]
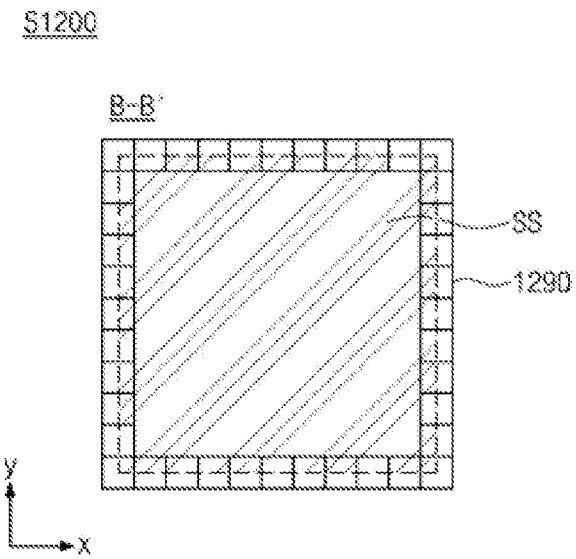
[Fig. 13B]
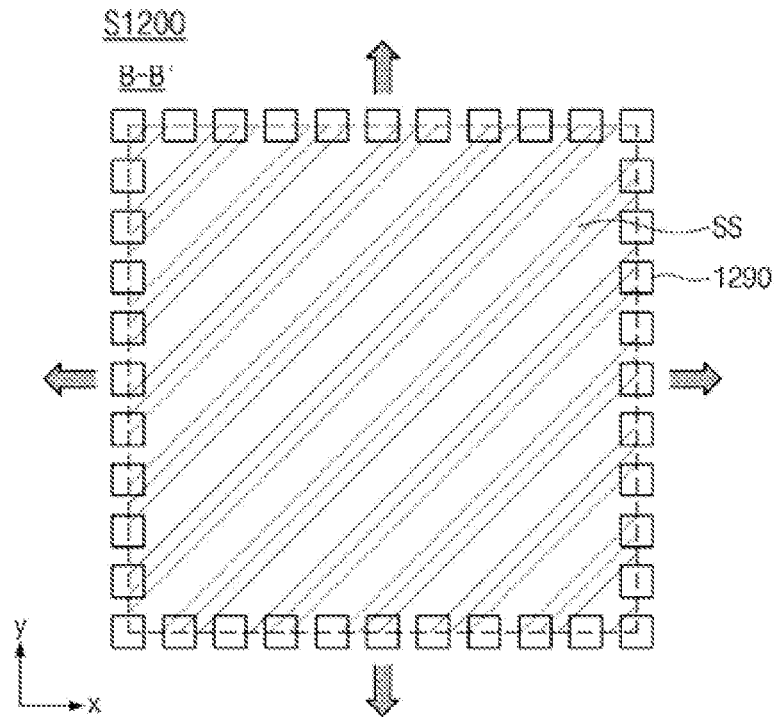

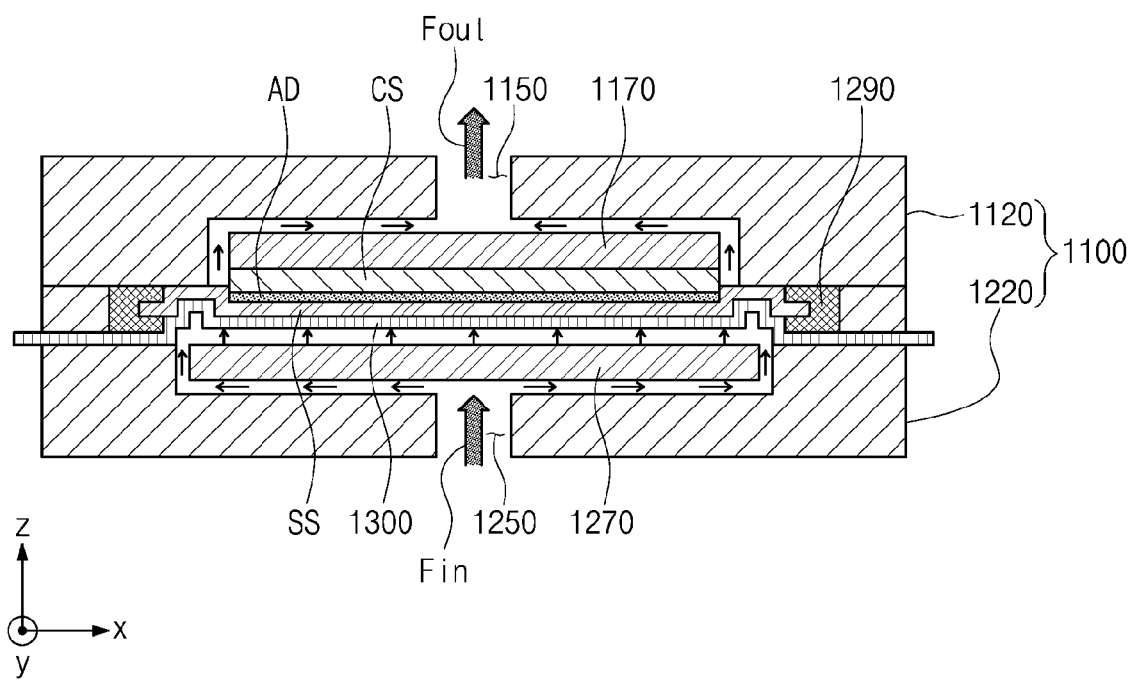
[Fig. 14]

STRETCHABLE SUBSTRATE, METHOD FOR MANUFACTURING STRETCHABLE SUBSTRATE, DEVICE FOR MANUFACTURING STRETCHABLE SUBSTRATE STRUCTURE, AND METHOD FOR MANUFACTURING STRETCHABLE SUBSTRATE STRUCTURE

TECHNICAL FIELD

The present invention relates to a stretchable substrate and a method for manufacturing the same. More specifically, the present invention relates to a stretchable substrate including a high stretchable region and a low stretchable region with a modulus gradually changing between the high stretchable region and the low stretchable region, as well as a method for manufacturing the same.

Further, the present invention relates to a device for manufacturing a stretchable substrate structure and a method for manufacturing the same. More specifically, the present invention relates to a device for manufacturing a stretchable substrate structure, in which a stretchable substrate is combined onto a carrier substrate by using an air pressure, as well as a method for manufacturing the same.

BACKGROUND ART

Recently, there have been ongoing studies on a stretchable electronic equipment, which may be scaled up and down while being stretched or shrunk in a first axis direction or a second axis direction.

For example, when taking a display into consideration as one example of the stretchable electronic equipment, conventional displays mean devices which simply output electrical signals in the form of videos. Recently, however, the displays have been developed not only as a device for simply displaying information, but also into having a flexible property. More specifically, the flexible displays have sequentially evolved into a bendable stage where the displays may be flexed and bent, a rollable stage where the displays may be rolled like a roll, and a foldable stage where the displays may be folded like apiece of paper. Further, the latest displays have evolved into a stretchable stage where the displays may be scaled up and down while being stretched or shrunk in a first axis direction or a second axis direction.

However, various technical problems have to be solved in order to manufacture the stretchable electronic equipment. For example, a stretchable substrate has to be provided to form various kinds of electronic elements. In this case, the stretchable substrate may be partitioned into a low stretchable region in which a low stretchable element, for example, a thin film transistor is formed, and a high stretchable region in which a high stretchable element, for example, a stretchable wiring is formed.

To date, research has been limited in that local stress is caused as a sharp difference of modulus occurs at the interface between the high and low stretchable regions of the stretchable substrate.

In addition, until now, technical studies for forming a stretchable substrate on a carrier substrate have not been sufficiently carried out.

Accordingly, the present inventors have invented a stretchable substrate and a method for manufacturing the same, in which a modulus gradually changes not to cause any local stress. Further, the present inventors have invented a device for manufacturing a stretchable substrate structure and a method for manufacturing the same, which provide a highly reliable stretchable substrate structure.

DISCLOSURE

Technical Problem

One technical object of the present invention is to provide a stretchable substrate with high durability and a method for manufacturing the same.

Another technical object of the present invention is to provide a stretchable substrate with a high yield and a method for manufacturing the same.

Still another technical object of the present invention is to provide a stretchable substrate with an easy process and a method for manufacturing the same.

Still another technical object of the present invention is to provide a device for manufacturing a stretchable substrate structure with an easy process and a method for manufacturing the same.

Still another technical object of the present invention is to provide a device for manufacturing a stretchable substrate structure with an excellent combining morphology between a carrier substrate and a stretchable substrate, as well as a method for manufacturing the same.

Still another technical object of the present invention is to provide a device for manufacturing a stretchable substrate structure with excellent economy and a method for manufacturing the same.

The technical objects of the present invention are not limited to the above.

Technical Solution

A method for manufacturing a stretchable substrate according to one embodiment of the present invention may include: providing a first solution having a first modulus after curing onto a carrier substrate; providing a second solution having a second modulus different from the first modulus after curing onto the carrier substrate; and curing the first solution and the second solution, in which a mixed solution of the first solution and the second solution may be formed by the providing of the second solution, and the mixed solution may provide an interface modulus gradually changing between the first modulus and the second modulus after the curing.

A method for manufacturing a stretchable substrate according to another embodiment of the present invention includes: providing a first solution having a first modulus after curing onto a carrier substrate; pre-curing the first solution; providing a second solution having a second modulus different from the first modulus after curing onto the carrier substrate; and mainly curing the pre-cured first solution and the second solution, in which a mixed solution of the pre-cured first solution and the second solution may be formed by the providing of the second solution, and the mixed solution may provide an interface modulus gradually changing between the first modulus and the second modulus after the main-curing.

According to embodiments, the providing of the second solution may be performed after the providing of the first solution, and the first modulus may be smaller than the second modulus.

According to embodiments, the first solution and the second solution may include liquid silicon rubber, and the second solution may include a curing agent more than that of the first solution.

According to embodiments, a difference between the first modulus and the second modulus may be 10 times or more.

According to embodiments, in the providing of the first solution, the first solution may be provided on an entire surface of the carrier substrate, and the second solution may be provided locally onto a predetermined region in the providing of the second solution.

According to embodiments, the second solution may be provided onto a predetermined region through a dispensing process or a transfer process with a pattern mask, or may be provided onto the predetermined region through the dispensing process without the pattern mask.

According to embodiments, at least one of the first solution and the second solution may include a visually distinguishable coloring agent.

According to embodiments, the interface modulus may gradually change between the first modulus and the second modulus in a plane direction of the carrier substrate and may be constant in the thickness direction of the carrier substrate.

According to another embodiment, in the pre-curing, the pre-curing of the first solution may be performed within a range in which the second solution, provided in the providing of the second solution, is absorbed into the pre-cured first solution.

A stretchable substrate according to one embodiment of the present invention includes: a first modulus region having a first modulus; a second modulus region located in a plane direction with regard to the first modulus region and having a second modulus higher than the first modulus; and a third modulus region located between the first modulus region and the second modulus region and having an interface modulus gradually changing between the first modulus and the second modulus, in which the interface modulus of the third modulus region may be constant in the thickness direction thereof.

According to one embodiment, the second modulus region may have an island shape surrounded by the first modulus region.

According to one embodiment, the first modulus region and the second modulus region may be visually distinguishable from each other.

According to one embodiment, the first to third modulus regions may have the same thickness as each other.

A device for manufacturing a stretchable substrate structure according to one embodiment of the present invention: a carrier substrate receiving portion configured to receive a carrier substrate therein; a stretchable substrate receiving portion configured to receive a stretchable substrate in a direction facing the carrier substrate; and a diaphragm configured to push the stretchable substrate in a direction of the carrier substrate according to air pressure to combine the stretchable substrate onto the carrier substrate.

According to one embodiment, the stretchable substrate may be formed of a material softer than the carrier substrate.

According to one embodiment, the stretchable substrate receiving portion may include a holder which holds at least one side of the stretchable substrate.

According to one embodiment, the holder may provide the stretchable substrate in a state in which the stretchable substrate is extended in a first axis direction before the stretchable substrate is combined.

According to one embodiment, the holder may provide the stretchable substrate in a state in which the stretchable substrate simultaneously extends in two axis directions before the stretchable substrate is combined.

According to one embodiment, the diaphragm may come into direct contact with the stretchable substrate in a plane direction by the air pressure to push the stretchable substrate in a direction of the carrier substrate.

According to one embodiment, the diaphragm may come into direct contact with an entire surface of the stretchable substrate in a plane direction by the air pressure.

According to one embodiment, the device for manufacturing a stretchable substrate structure may further include a housing configured to provide the carrier substrate receiving portion and the stretchable substrate receiving portion, and the housing may further include an air outlet configured to discharge air around the carrier substrate to form the air pressure.

According to one embodiment, the air outlet may be formed in the housing, and may be formed in a direction opposite to the direction in which the stretchable substrate receiving portion is provided based on the carrier substrate receiving portion.

According to one embodiment, the device for manufacturing a stretchable substrate structure may further include a housing configured to provide the carrier substrate receiving portion and the stretchable substrate receiving portion, and the housing may further include an air inlet configured to bring in an influx of air to push the diaphragm in a direction of the stretchable substrate.

According to one embodiment, the air inlet may be formed in the housing, and may be formed in a direction opposite to the direction in which the carrier substrate receiving portion is provided based on the carrier substrate receiving portion.

A method for manufacturing a stretchable substrate structure according to one embodiment of the present invention may include: providing a carrier substrate; providing a stretchable substrate to face the carrier substrate; and pushing the stretchable substrate in a direction of the carrier substrate according to air pressure to combine the stretchable substrate onto the carrier substrate.

According to one embodiment, the providing of the carrier substrate may further include forming an adhesive on the carrier substrate in a direction toward the stretchable substrate.

According to one embodiment, the providing of the stretchable substrate may further include simultaneously elongating the stretchable substrate at least in two axis directions. In the combining, an adhesive force between the stretchable substrate and the adhesive may be greater than a restoring force of the elongated stretchable substrate.

According to one embodiment, in the combining, the adhesive force between the adhesive and the carrier substrate may be greater than the adhesive force between the stretchable substrate and the adhesive.

According to one embodiment, the adhesive force of the adhesive may vary depending on temperatures.

According to one embodiment, the stretchable substrate may include a high stretchable region and a low stretchable region which has a lower stretchability than the high stretchable region.

According to one embodiment, the carrier substrate in the providing of the carrier substrate may be smaller than the stretchable substrate in the providing of the stretchable substrate.

Advantageous Effects

According to one embodiment of the present invention, a stretchable substrate can be divided into a high stretchable region and a low stretchable region and a region with a gradually changing modulus can be provided onto a boundary between the high stretchable region and the low stretchable region, thereby providing the stretchable substrate with high durability. Furthermore, the modulus gradually changes in a plane direction from the high stretchable region to the low stretchable region and the modulus is also constant in a thickness direction thereof, and thus a local stress along a folding direction can be minimized.

With regard to the stretchable substrate according to one embodiment of the present invention, the high stretchable region, the low stretchable region and the region with the modulus gradually changing can be visually distinguishable from each other, thereby providing the convenience of inspection.

With regard to the stretchable substrate according to one embodiment of the present invention, the high stretchable region, the low stretchable region and the region with the modulus gradually changing can have the same thickness as each other, and thus can contribute to enhancing a yield of follow-up processes.

A method for manufacturing a stretchable substrate according to one embodiment of the present invention can provide a first solution configured to provide a high stretchable region and a second solution configured to provide a low stretchable region, thereby forming a mixed solution in which the first solution and the second solution are mixed with each other, and such mixed solution can function as a region with a modulus gradually changing by means of curing. In other words, there is no need for a separate solution to form the region with the modulus gradually changing, and thus a process can become simple.

A device for manufacturing a stretchable substrate structure according to one embodiment of the present invention can include a diaphragm configured to push a stretchable substrate in a direction of a carrier substrate according to air pressure to combine the stretchable substrate onto the carrier substrate.

Such device uses the air pressure as a driving force for combining, and thus can provide an even combining force over an entire surface of the stretchable substrate. Accordingly, it is possible to solve a problem in which the stretchable substrate is unintentionally deformed during a combining process. Thus, one embodiment of the present invention can provide an excellent adhesive property between the stretchable substrate and the carrier substrate.

Further, the air pressure is used as a driving force for combining, and thus the stretchable substrate and the carrier substrate can be easily combined to each other, thereby providing excellent process economy.

The technical effects of the present invention are not limited to the above.

DESCRIPTION OF DRAWINGS

FIG. 1 is a view for explaining a stretchable substrate according to one embodiment of the present invention.

FIGS. 2A and 2B are views for explaining a modulus size according to a position in A-A' and B-B' of FIG. 1.

FIG. 3 is a flow chart for explaining a method for manufacturing a stretchable substrate according to one embodiment of the present invention.

FIG. 4 is a view for explaining step S110.

FIGS. 5A, 5B and 6 are views for explaining step S120.

FIG. 7 is a flow chart for explaining a method for manufacturing a stretchable substrate according to another embodiment of the present invention.

FIG. 8 is an experimental picture for explaining the excellence of a stretchable substrate according to one embodiment of the present invention.

FIGS. 9A, 9B, 9C and 9D are views for explaining an application example of a stretchable substrate according to one embodiment of the present invention.

FIG. 10 is a view for explaining a device for manufacturing a stretchable substrate structure according to one embodiment of the present invention.

FIG. 11 is a view for explaining a method for manufacturing a stretchable substrate structure according to one embodiment of the present invention.

FIG. 12 is a view for explaining step S1100 in detail according to one embodiment of the present invention.

FIGS. 13A and 13B are views for explaining step S1200 in detail according to one embodiment of the present invention.

FIG. 14 is a view for explaining step S1300 in detail according to one embodiment of the present invention.

BEST MODE

Mode for Invention

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added. In addition, the term "connection" used herein may include the meaning of indirectly connecting a plurality of components, and directly connecting a plurality of components.

Further, in the following description of the present invention, a detailed description of known functions and configurations incorporated herein will be omitted when it may make the subject matter of the present invention unnecessarily unclear.

FIG. 1 is a view for explaining a stretchable substrate according to one embodiment of the present invention, and FIGS. 2A and 2B are views for explaining a modulus size according to a position in A-A' and B-B' of FIG. 1.

Referring to FIG. 1, a stretchable substrate 100 according to one embodiment of the present invention may include: a first modulus region 110 having a first modulus; a second modulus region 120 having a second modulus; and a third modulus region 130 having an interface modulus gradually changing between the first modulus and the second modulus.

For example, the first modulus of the first modulus region 110 may be smaller than the second modulus of the second modulus region 120. In other words, the first modulus region 110 may correspond to a high stretchable region, and the second modulus region 120 may correspond to a low stretchable region. For example, a difference between the first modulus and the second modulus may be 10 times or more.

The third modulus region 130 may be understood as an interface region between the first modulus region 110 and the second modulus region 120. In other words, the third modulus region 130 may be located between the first modulus region 110 and the second modulus region 120 in a plane direction of the stretchable substrate 100. In the present specification, the third modulus region 130 may be called a mixed region, too.

The shape and size of the first to third modulus regions 110, 120 and 130 may be varied. For example, the first and second modulus regions 110 and 120 may have a stripe shape when viewed on a plane (XY plane) as shown in FIG. 1. In this case, the third modulus region 130 may take on a stripe shape between the first and second modulus regions 110 and 120. Further, the second modulus region 120 may have an island shape surrounded by the first modulus region 110 when viewed on a plane (XY plane), though not shown in FIG. 1. In this case, the third modulus region 130 may be located between the first and second modulus regions 110 and 120 and have an island shape surrounded by the first modulus region 110.

In addition, the first to third modulus regions 110, 120 and 130 may provide substantially the same height without a step difference in the thickness direction thereof (Z axis direction) as shown in FIG. 1. Accordingly, a local stress caused by the step difference may be minimized on a boundary between the first to third modulus regions 110, 120 and 130, and a follow-up process for forming various electronic elements on the first to third modulus regions 110, 120 and 130 may be easily performed.

Hereinafter, referring to FIGS. 2A and 2B, the modulus according to each region of the stretchable substrate 100 will be described in detail.

Referring to FIG. 2A showing a modulus change in A-A' of FIG. 1, it may be identified that the first modulus of the first modulus region 110 is smaller than the second modulus of the second modulus region 120. Furthermore, it may be identified that an interface modulus of the third modulus region 130 located between the first modulus region 110 and the second modulus region 120 gradually changes between the first modulus and the second modulus.

In this case, a gradual change in modulus may be understood as a concept including all the cases in which the interface modulus has a slope of line between the first and second moduli; a slope of curve therebetween; and a mixture of slopes of line and curve therebetween.

As such, the third modulus region 130 may play a role to buffer a difference between the first modulus of the first modulus region 110 and the second modulus of the second modulus region 120. From another point of view, a boundary between the high stretchable region (first modulus region) and the low stretchable region (second modulus region) may be softened by the third modulus region. If the first modulus region 110 comes into direct contact with the second modulus region 120, a local stress may occur due to a modulus difference. However, the third modulus region 130 may play a role to buffer the modulus difference between the first and second modulus regions 110 and 120, and thus minimize the occurrence of the local stress.

Further, referring to FIG. 2B showing a modulus change in B-B' of FIG. 1, it may be identified that the modulus is constant according to a thickness of the third modulus region 130. In other words, a constant modulus may be provided from the bottom surface to the top surface of the third modulus region 130. The third modulus region 130 may provide the constant modulus in the thickness direction thereof, thereby providing a stretchable environment with high reliability regardless of a direction of curvature applied to the stretchable substrate 100. In addition, the first and second modulus regions 110 and 120 may have the constant modulus in the thickness direction thereof, though not shown in the figure.

According to one embodiment, the first and second modulus regions 110 and 120 may be visually distinguishable from each other. For example, the first and second modulus regions 110 and 120 may have a different color from each other. Further, the third modulus region 130 may have a mixture of the color of the first modulus region 110 and the color of the second modulus region 120. Accordingly, the first to third modulus regions 110, 120 and 130 may be visually distinguishable from each other, thereby providing the convenience of visual inspection.

The stretchable display according to one embodiment of the present invention has been described above with reference to FIGS. 1 and 2. Hereinafter, the method for manufacturing a stretchable substrate according to one embodiment of the present invention will be described with reference to FIGS. 3 to 6.

FIG. 3 is a flowchart for explaining a method for manufacturing a stretchable substrate according to one embodiment of the present invention, FIG. 4 is a view for explaining step S110, and FIGS. 5 and 6 are views for explaining step S120.

Referring to FIG. 3, the method for manufacturing a stretchable substrate according to one embodiment of the present invention may include at least one of providing a first solution having a first modulus after curing onto a carrier substrate (S110); providing a second solution having a second modulus different from the first modulus after curing onto the carrier substrate (S120); and curing the first solution and the second solution (S130). Hereinafter, each step will be described.

Step S110

In step S110, a first solution having a first modulus after curing may be provided onto a carrier substrate. To explain step S110, reference is made to FIG. 4 together.

The carrier substrate (CS) may function as a supporting substrate for forming the stretchable substrate 100. The carrier substrate (CS) may be formed of a material capable of providing a predetermined supporting force, for example, at least one material of glass, plastic, a metal plate, and a silicon wafer. Since the material for the carrier substrate (CS) is only one example, it is not limited to the listed materials.

The first solution 112 having the first modulus after curing may be provided onto the carrier substrate (CS). As described above, the first modulus may be smaller than the second modulus, which will be described later. In other words, the first solution 112 may be understood as a solution for forming a high stretchable region. For this purpose, the first solution 112 may include, for example, a liquid silicon rubber material. The liquid silicon rubber material has a crosslink density varying depending on the content of a curing agent, and thus may find it easy to control a modulus after curing. The first solution 112 is not limited to certain materials.

The first solution 112 may further include a coloring agent containing pigments or dyes such that the first solution 112 may be visually distinguishable from a second solution, which will be described later.

The first solution 112 may be formed on an entire surface of the carrier substrate (CS). In this case, the first solution 112 may be formed on the carrier substrate (CS) by various methods. For example, the first solution 112 may be formed on the carrier substrate (CS) by at least one method out of spin coating, slit coating, blade coating, bar coating, spray coating, inkjet coating, etc.

Step S120

In step S120, a second solution having a second modulus different from the first modulus after curing may be provided onto the carrier substrate. To explain step S120, reference is made to FIGS. 5 and 6 together.

The second solution 122 may have the second modulus after curing. As described above, the second modulus may be larger than the first modulus that the first solution 112 has after curing. In other words, if the first solution 112 provides a high stretchable region after curing, the second solution 122 may provide a low stretchable region after curing. For this purpose, the second solution 122 may include, for example, a liquid silicon rubber material. In this case, the second solution 122 may include a curing agent in order to provide a modulus larger than that of the first solution 112. In this case, it may be understood that the first solution 112 and the second solution 122 are formed of the same material and are distinguishable from each other depending on the content of the curing agent. Further, the second solution 122 is not limited to certain materials.

The second solution 122 may also further include a coloring agent containing pigments or dyes such that the second solution 122 may be visually distinguishable from the first solution 112, which has been described above. If the first solution 112 includes the coloring agent, the second solution 122 may not include the coloring agent. In contrast, if the second solution 122 includes the coloring agent, the first solution 112 may not include the coloring agent.

The second solution 122 may be provided onto a predetermined region. The second solution 122 forms the low stretchable region, and the low stretchable region needs to have an island shape surrounded by the high stretchable region that the first solution 112 forms. In other words, the first solution 112 may be formed on the entire surface of the carrier substrate (CS), while the second solution 122 may be locally provided.

The second solution 122 may be provided by various methods. For example, a pattern mask having an opening region (OP) and a closing region (CL) in a predetermined pattern may be provided on the carrier substrate (CS) as shown in FIG. 5(a). Accordingly, the second solution 122 may be dispensed onto a desired position through the opening region (OP) of the pattern mask (Mask). As another example, a transfer substrate (TS), in which a protruding portion of its groove is stained with the second solution 122, may be provided onto the carrier substrate (CS) as shown in FIG. 5(b). The protruding portion of the transfer substrate (TS) comes into direct contact with the carrier substrate (CS), and thus the second solution 122 may be transferred onto a desired position. As another example, the second solution 122 may be directly formed on a desired position without the pattern mask through needle dispensing or inkjet dispensing. As a result, the second solution 122 may be selectively formed in a predetermined region.

The second solution 122 provided according to step S120 and the first solution 110 provided according to step S110 may be mixed with each other. As the first solution 112 and the second solution 122 are mixed with each other in a plane direction of the carrier substrate (CS) (See an arrow direction), a mixed solution 132 may be formed accordingly as shown in FIG. 6.

For example, the first solution 112 and the second solution 122 may be gradually mixed with each other as time goes by. As the first solution 112 and the second solution 122 are mixed together, the mixed solution 132 is provided. Thus, a gradual change in modulus may be induced in a plane direction and a constant modulus may be provided in the thickness direction thereof as described in FIGS. 2A and 2B.

In this case, the first solution 112 providing a small modulus may be first formed on the carrier substrate (CS) and the second solution 122 providing a large modulus may be provided on the first solution 112, thereby providing a smoother mixing. If the hard second solution 122 is first formed and the soft first solution 112 is absorbed into the second solution 122, a range of mixing may become narrowed. In this case, however, the hard second solution 112 is absorbed into the soft first solution 112, and thus a mixed solution may be formed in a larger range thereof. As a result, a size of the third modulus region may be increased as described with reference to FIG. 1, and thus a more gradual change in modulus may be induced.

Step S130

In step S130, the first solution and the second solution may be cured. Specifically, the first solution 112 provided in step S110, the second solution 122 provided in step S120 and the mixed solution 132 of the first solution 112 and the second solution 122 may be cured, and thus a phase change from liquid to solid may be performed.

The curing according to step S130 may be removed through various ways. In this case, if the first solution 112 and the second solution 122 are based on the same material as each other, a curing process may be simplified.

By the curing above, the first solution 112 may form the first modulus region 110 having a low modulus, the second solution 122 may form the second modulus region 120 having a high modulus, and the mixed solution 132 may form the third modulus region 130 (mixed region) with the modulus gradually changing as described with reference to FIGS. 1 and 2.

As a result, the stretchable substrate may be provided as described with reference to FIGS. 1 and 2. The method for manufacturing the stretchable substrate according to one embodiment of the present invention has been described above with reference to FIGS. 3 to 6. Hereinafter, the method for manufacturing the stretchable substrate according to another embodiment of the present invention will be described with reference to FIG. 7.

FIG. 7 is a flow chart for explaining a method for manufacturing a stretchable substrate according to another embodiment of the present invention.

Referring to FIG. 7, the method for manufacturing the stretchable substrate according to another embodiment of the present invention may include at least one of providing a first solution having a first modulus after curing onto a carrier substrate (S210); pre-curing the first solution (S220); providing a second solution having a second modulus different from the first modulus after curing onto the carrier substrate (S230); and curing the pre-cured first solution and the second solution (S240).

In comparison with the embodiment described above with reference to FIG. 3, an embodiment to be described with reference to FIG. 7 has a difference in that the pre-curing of the first solution is included between the providing of the first solution and the providing of the second solution. Hereinafter, the description will be made with regard to distinctive steps while omitting the description about the redundant steps.

Step S210 corresponds to step S110 and thus specific description thereof will be omitted.

In step S220, the first solution may be pre-cured. In step S220, the first solution may be pre-cured and the pre-curing may be performed to the extent that the second solution may be absorbed into the pre-cured first solution.

In step S230, the second solution may be provided onto the pre-cured first solution. Since the second solution is absorbed into the pre-cured first solution, a range of mixing may become more uniform when the pre-cured first solution and the second solution are mixed together. For example, if the second solution is mixed with the pre-cured first solution, the size and shape of the mixed solution may become more uniform.

In step S240, the pre-cured first solution, the second solution and the mixed solution of the pre-cured first solution and the second solution may be mainly cured.

As a result, the stretchable substrate according to one embodiment of the present invention may be provided as described with reference to FIGS. 1 and 2.

Hereinafter, the excellence of the stretchable substrate according to one embodiment of the present invention will be described with reference to FIG. 8.

FIG. 8 is an experimental picture for explaining the excellence of a stretchable substrate according to one embodiment of the present invention.

According to one embodiment of the present invention, the stretchable substrate is made ready, and FIG. 8(a) is a picture thereof before stretching and FIG. 8(b) is a picture thereof after stretching. It may be understood that a low stretchable region is inside a blue box, a high stretchable region is outside the blue box, and a mixed region in on a boundary of the blue box, in this case. Referring to 8(b), it may be identified that there is almost no difference of length inside the blue box before and after stretching; P1 before stretching is stretched to P1' after stretching; P2 before stretching is stretched to P2' after stretching; P3 before stretching is stretched to P3' after stretching; and P4 before stretching is stretched to P4' after stretching. As a result, a difference of stretchability may be identified in the first modulus region 110 inside the blue box, the second modulus region 120 outside the blue box, and the third modulus region 130 on the boundary of the blue box. In other words, it may be identified that the first modulus region 110 inside the blue box was not almost stretched at all, the second modulus region 120 outside the blue box was much stretched, and the third modulus region 130 on the boundary of the blue box was stretched a little bit. As a result, it may be seen that the stretchable substrate according to one embodiment of the present invention has at least three moduli.

The excellence of the stretchable substrate according to one embodiment of the present invention has been described above with reference to FIG. 8. Hereinafter, an application example of the stretchable substrate according to one embodiment of the present invention will be described with reference to FIGS. 9A, 9B, 9C and 9D.

FIGS. 9A, 9B, 9C and 9D are views for explaining an application example of a stretchable substrate according to one embodiment of the present invention.

FIG. 9(a) shows the stretchable substrate 100 formed on the carrier substrate (CS) according to the embodiments as described with reference to FIG. 3 or 7. The carrier substrate (CS) may be removed if necessary. For example, various electronic elements may be formed on the stretchable substrate 100 without removing the carrier substrate (CS) therefrom. Alternatively, the stretchable substrate 100 may be moved from the carrier substrate (CS) to a process substrate (PS), and then various electronic elements may be formed thereon.

Hereinafter, for the purpose of convenience of description, it is assumed that the carrier substrate (CS) is removed from the stretchable substrate 100 as shown in FIG. 9(b).

The stretchable substrate 100 separated from the carrier substrate (CS) may be formed on the process substrate (PS) through an adhesive (AD) as shown in FIG. 9(c). The process substrate (PS) may provide a supporting force required for forming various electronic elements on the stretchable substrate 100. In this case, the stretchable substrate 100 may be formed on the process substrate (PS) as it is without any change. Alternatively, the stretchable substrate 100 may be formed on the process substrate (PS) in an elongated state. For example, the stretchable substrate 100 may be formed on the process substrate (PS) in a state in which the stretchable substrate 100 is elongated 200% or less, for example, 150% or less based on an area thereof.

After that, high stretchable electronic elements, for example, a stretchable wiring (SL) may be formed on a low stretchable region of the stretchable substrate (100) as shown in FIG. 9(d). Further, low stretchable electronic elements, for example, driving elements (DR) such as a thin film transistor may be formed on a high stretchable region of the stretchable substrate 100.

The process substrate (PS) may be removed therefrom after all the required electronic elements are formed on the stretchable substrate 100, though not shown in figures.

The stretchable substrate according to one embodiment of the present invention may be applied to manufacturing a stretchable electronic equipment, for example, stretchable displays and stretchable solar cells according to the method described above. The listed examples of application are provide only for illustration and such stretchable substrate may be applied to more stretchable electronic equipment fields.

The application examples of the stretchable substrate according to one embodiment of the present invention have been described above with reference to FIGS. 9A, 9B, 9C and 9D.

According to the embodiment described above, the low modulus region and the high modulus region may be provided onto the stretchable substrate, and a gradually changing interface modulus region may be provided between the low modulus region and the high modulus region, thereby minimizing the occurrence of a local stress. As a result, the stretchable substrate with high stability may be provided.

Further, the interface modulus region is formed by mixing the first solution providing a low modulus and the second solution providing a high modulus, and thus a process thereof may be simple enough to maximize a yield.

In addition, due to the mixing of the first solution and the second solution, the mixed region configured to provide a gradually changing modulus may be provided and thus a constant modulus may be provided in the thickness direction thereof. If the mixing is forced to occur in the upper or lower side of the first and second solutions, it may be difficult to provide a constant modulus in the thickness direction thereof. For example, if the mixing is forced to occur in the upper side of the first and second solutions, the first solution and the second solution are mixed well in the upper side, but mixed less in the lower side, and thus an uneven modulus may be provided in the thickness direction thereof. On the contrary, according to one embodiment of the present invention, as the first and second solutions are naturally mixed, the mixed region in which the first solution and the second solution are mixed is formed, and thus a constant modulus may be formed in the thickness direction. As a result, the stretchable substrate with high reliability may be provided.

The stretchable substrate according to one embodiment of the present invention has been described above with reference to FIGS. 1 and 9. Hereinafter, a device for manufacturing a stretchable substrate structure and a method for manufacturing the same by using the stretchable substrate according to one embodiment of the present invention will be described with reference to FIGS. 10 to 14.

The device for manufacturing a stretchable substrate structure according to one embodiment of the present invention provides the stretchable substrate structure in which the stretchable substrate is attached onto the carrier substrate, and the stretchable substrate may be combined onto the carrier substrate by air pressure. Hereinafter, the device for manufacturing the stretchable substrate according to one embodiment of the present invention will be described with reference to FIG. 10.

FIG. 10 is a view for explaining a device for manufacturing a stretchable substrate structure according to one embodiment of the present invention.

Referring to FIG. 10, the device for manufacturing a stretchable substrate structure 1000 according to one embodiment of the present invention may include: a carrier substrate receiving portion (now shown) configured to receive a carrier substrate (CS) therein; a stretchable substrate receiving portion 1290 configured to receive a stretchable substrate (SS) in a direction facing the carrier substrate (CS); and a diaphragm 1300 configured to push the stretchable substrate (SS) in a direction of the carrier substrate (CS) according to air pressure to combine the same onto the carrier substrate (CS).

According to one embodiment, the stretchable substrate (SS) may be the stretchable substrate 100 as described with reference to FIGS. 1 to 9.

The device for manufacturing the stretchable substrate structure 1000 according to one embodiment of the present invention may include a housing 1100. The housing 1100 may include a first housing 1120 configured to receive the carrier substrate (CS) therein and a second housing 1220 configured to receive the stretchable substrate (SS) therein. FIG. 10 shows that the first housing 1120 is located on the upper side than the second housing 1220 in a Z axis direction. However, the second housing 1220 may be also located on the upper side than the first housing 1120 in the Z axis direction.

The first housing 1120 and the second housing 1220 may be formed of individual modules capable of being assembled such that the first housing 1120 may receive the carrier substrate (CS) and the second housing 1220 may receive the stretchable substrate (SS). In other words, since the first housing 1120 and the second housing 1220 are provided separately from each other, the convenience of work may be enhanced in such a way that the first housing 1120 receives the carrier substrate (CS) and the second housing 1220 receives the stretchable substrate (SS).

Further, in a process of combining the stretchable substrate (SS) and the carrier substrate (CS), the stretchable substrate (SS) and the carrier substrate (CS) may be closely connected to each other such that the air inside the housing 1100 formed of the first housing 1120 and the second housing 1220 may not flow out from a crack therein.

To summarize, the first housing 1120 configured to receive the carrier substrate (CS) and the second housing 1220 configured to receive the stretchable substrate (SS) are formed as a separate housing. In the process of combining the same, the first housing 112 and the second housing 1220 may be closely connected to each other, thereby providing an environment for easy substrate loading and vacuum combining.

An air outlet providing portion 117 may be formed in one side of the first housing 1120. The air outlet providing portion 117 may discharge the air inside the first housing 1120, for example, the air around the carrier substrate (CS) through an air outlet 1150, thereby providing an air outlet passage.

According to one embodiment, an air outlet 1150 may be formed in one side of the first housing 1120. The air around the carrier substrate (CS) may be discharged through the air outlet 1150. For this purpose, the air outlet 1150 may be made ready in a direction opposite to the direction in which the carrier substrate (CS) faces the stretchable substrate (SS), that is, an +Z axis direction of the carrier substrate (CS). For the purpose of convenience of description, FIG. 10 shows one air outlet 1150. Alternatively, however, a plurality of air outlets 1150 may be provided. Further, a vacuum pump may be connected to one end of the air outlet 1150 to discharge the air from the inside of the housing 1100 by force.

The stretchable substrate receiving portion 1290 may include a holder disposed in one side of the second housing 1220. The holder may perform a function of holding at least one side, for example, four sides of the stretchable substrate (SS).

The holder may hold the stretchable substrate (SS) and fix the stretchable substrate (SS) in a state in which the stretchable substrate (SS) extends in at least one axis direction. For example, the holder may fix the stretchable substrate (SS) in a state in which the stretchable substrate (SS) simultaneously extends in two axis directions. In other words, the holder may not simply hold the stretchable substrate (SS), but may elongate the stretchable substrate (SS) and hold the stretchable substrate (SS) in order to maintain an elongated state thereof.

The diaphragm 1300 may be disposed in one side of the second housing 1220 and may perform a function of pushing the stretchable substrate (SS) in a direction of the carrier substrate (CS) according to air pressure to combine the stretchable substrate (SS) onto the carrier substrate (CS). For example, the diaphragm 1300 may come into direct contact with the stretchable substrate (SS) in a plane direction (XY plane) by the air pressure to push the stretchable substrate (SS) in a direction of the carrier substrate (CS).

For this purpose, the diaphragm 1300 may be disposed in one side of the stretchable substrate (SS), for example, a lower side of the stretchable substrate (SS). In other words, with regard to a Z axis direction, the carrier substrate (CS) may be loaded in a +Z axis direction while being spaced apart from the stretchable substrate (SS) and the diaphragm 1300 may be disposed in a −Z axis direction while being spaced apart from the stretchable substrate (SS) in a state in which the stretchable substrate (SS) is interposed between the carrier substrate (CS) and the diaphragm 1300.

In this case, the air flowing in from the lower side of the diaphragm 1300 may push the diaphragm 1300. The pushed diaphragm 1300 may push the stretchable substrate (SS) in a direction of the carrier substrate (CS). A principle of operating the diaphragm 1300 will be described later in detail.

An air inlet providing portion 127 may be provided inside the second housing 1220. The air inlet providing portion (127) may provide a passage through which the air flowing in through the air inlet 1250 may be supplied to the inside of the second housing 1220, for example, the diaphragm 1300.

According to one embodiment, an air inlet 1250 may be formed in one side of the second housing 1220. Air may flow therein through the air inlet 1250 to push the diaphragm 1300.

For this purpose, the air inlet 1250 may be made ready in a direction opposite to the direction in which the stretchable substrate (SS) faces the carrier substrate (CS), that is, the −Z axis direction. The air may flow therein through the air inlet 1250 to form an air pressure configured to push the stretchable substrate (SS) in a direction of the carrier substrate (CS) inside the housing 1100 along with the air outlet 1150. A pump may be connected thereto such that the air may flow to the inside of the housing 1100 by force through the air let 1250.

In this case, the air flowing in through the air inlet 1250 may be provided an air passage to push the diaphragm. 1300 across an entire surface thereof, for example, an entire surface of XY. As a result, the diaphragm 1300 may make a direct contact across the entire surface of the stretchable substrate (SS) in a plane direction by the air pressure.

The device for manufacturing the stretchable substrate structure according to one embodiment of the present invention has been described above with reference to FIG. 10. Hereinafter, the method for manufacturing the stretchable substrate structure according to one embodiment of the present invention will be described with reference to FIG. 11.

FIG. 11 is a view for explaining a method for manufacturing a stretchable substrate structure according to one embodiment of the present invention. FIG. 12 is a view for explaining step S1100 in detail according to one embodiment of the present invention, FIGS. 13A and 13B are views for explaining step S1200 in detail according to one embodiment of the present invention, and FIG. 14 is a view for explaining step S1300 in detail according to one embodiment of the present invention.

The method for manufacturing a stretchable substrate structure according to one embodiment of the present invention may be implemented by the device for manufacturing the stretchable substrate structure according to one embodiment of the present invention as described with reference to FIG. 10.

Referring to FIG. 11, the method for manufacturing the stretchable substrate structure according to one embodiment of the present invention may include at least one of providing a carrier substrate (S1100); providing a stretchable substrate to face the carrier substrate (S1200); and pushing the stretchable substrate in a direction of the carrier substrate according to air pressure to combine the stretchable substrate onto the carrier substrate (S1300). Hereinafter, each step will be described.

Step S1100

In step S1100, the carrier substrate (CS) may be provided. The carrier substrate (CS) may perform a role for supporting the stretchable substrate (SS) to be combined thereto. For this purpose, the carrier substrate (CS) may be formed of a material capable of providing a predetermined support force, for example, at least one material of glass, plastic, a metal plate, and a silicon wafer. Since the material of the carrier substrate (CS) is only one example, it is not limited to the listed materials.

Step S1100 may further include forming an adhesive on the carrier substrate (CS) in a direction toward the stretchable substrate (SS). For example, an adhesive (AD) may be formed on the carrier substrate (CS) as shown in FIG. 12. The up and down directions of the carrier substrate (CS) and the adhesive (AD) may change as shown in FIG. 12. The adhesive (AD) may be a double-sided adhesive. In this case, the double-sided adhesive may be an adhesive having an adhesive force that varies depending on the temperature. For example, the double-sided adhesive may have the property of losing adhesion at −30° C. or less. Further, the adhesive property of the adhesive (AD) may be maintained even at a process temperature, at which various electronic elements are formed on the stretchable substrate (SS).

The adhesive (AD) may be formed on one surface of the carrier substrate (CS) after cleansing the carrier substrate (CS).

The carrier substrate with the adhesive (AD) formed therein may settle inside the first housing 1120.

As a result, in step S1100, the carrier substrate (CS) may be provided.

Step S1200

In step S1200, the stretchable substrate (SS) may be provided to face the carrier substrate (CS).

First of all, the stretchable substrate (SS) may be made ready. The stretchable substrate (SS) may be formed of a material softer than that of the carrier substrate (CS). Furthermore, the stretchable substrate (SS) may be formed of a polymer material capable of being repeatedly stretched or shrunk. In this case, the stretchable substrate (SS) may include a high stretchable region and a low stretchable region having lower stretchability than the high stretchable region.

A size of the stretchable substrate (SS) may be larger than that of the carrier substrate (CS). Specifically, an XY plane size of the stretchable substrate (SS) may be larger than an XY plane size of the carrier substrate (CS).

Pre-treatment may be performed on the stretchable substrate (SS). For example, the stretchable substrate (SS) may undergo a predetermined cleansing process. Further, one surface of the stretchable substrate (SS), for example, a surface to be attached onto the adhesive (AD) of the carrier substrate (CS) may undergo an atmospheric pressure plasma process.

According to one embodiment, the stretchable substrate (SS) may be elongated, for example, by 20% in two axis directions as shown in FIG. 13(b), in a state in which the stretchable substrate (SS) is fixed by the holder as shown in FIG. 13(a). In this case, the holder may hold the stretchable substrate (SS), in a state in which the stretchable substrate (SS) is elongated. In this case, the holder may simultaneously elongate the stretchable substrate (SS) in two axis directions.

In contrast, if the holder elongates the stretchable substrate (SS) in one axis direction and then elongates the same in another axis direction, a tensile force is formed on the stretchable substrate in an axis direction in which the stretchable substrate is first elongated, and thus it may be difficult to sequentially elongate the stretchable substrate in another axis direction. In contrast, in one embodiment of the present invention, the stretchable substrate (SS) may be simultaneously elongated in two axis directions, thereby maximizing a surface elongation.

According to one embodiment, the stretchable substrate (SS) may be combined onto the carrier substrate (CS) in a state in which the stretchable substrate (SS) is elongated, and thus an adhesive force between the stretchable substrate (SS) and the adhesive (AD) may be larger than a restoring force of the elongated stretchable substrate (SS). Further, an adhesive force between the adhesive (AD) and the carrier substrate (CS) may be larger than a restoring force of the elongated stretchable substrate (SS). In addition, the adhesive force between the carrier substrate (CS) and the adhesive (AD) may be larger than the adhesive force between the stretchable substrate (SS) and the adhesive (AD). In this case, the adhesive force provided by the adhesive (AD) may be evaluated by 180 degree peeling strength. Further, the restoring force of the stretchable substrate (SS) in the elongated state may be evaluated through a strain-stress analysis.

As a result, the stretchable substrate (SS) may be provided by step S1200.

Step S1300

In step S1300, the stretchable substrate (SS) may be pushed in a direction of the carrier substrate (CS) according to air pressure to combine the stretchable substrate (SS) onto the carrier substrate (CS).

For step S1300, the first housing 1120 with the carrier substrate (CS) loaded thereon and the second housing 112 with the stretchable substrate (SS) loaded thereon may be connected in a direction facing each other.

Further, in step S1300, the air may flow in (Fin) to the inside the second housing 1220 through the air inlet 1250 as shown in FIG. 14. For example, the air inside the housing 1100, for example, the first housing 1120 may also flow out (Fout) through the air outlet 1150.

Describing specifically, the air may flow out through the air outlet 1150, and thus a low pressure state may be induced inside the housing 1100 compared to that of the outside of the housing 1100. For example, a vacuum state may be induced inside the housing 1100.

The air flowing in through the air inlet 1250 may move along an air passage made ready inside the second housing 1220. In this case, a low pressure state may be induced inside the housing 1100, and thus the air flowing in through the air inlet 1250 may push the diaphragm 1300 in a direction of the adhesive (AD) of the carrier substrate (CS). For example, the diaphragm 1300 may be deformed in a +Z axis direction by air pressure, in a state of being first located at a distanced interval in a −Z axis direction of the stretchable substrate (SS). As the diaphragm 1300 is deformed, the diaphragm 1300 may push the stretchable substrate (SS) in a direction of the adhesive (AD) of the carrier substrate (CS) in a state of coming into plane contact with one surface of the stretchable substrate (SS). In other words, the diaphragm 1300 may push the stretchable substrate SS in a direction of the carrier substrate (CS) in a state in which the stretchable substrate comes into contact with a wide area of the carrier substrate.

As the diaphragm 1300 pushes the stretchable substrate (SS) by air pressure in a direction of an adhesive (AD) formed on the carrier substrate (CS), the stretchable substrate (SS) may be combined onto the carrier substrate (CS) through the adhesive (AD). The stretchable substrate (SS) may be combined onto the carrier substrate (CS) by air pressure, thereby providing an excellent combining morphology.

Alternatively, if the stretchable substrate is attached onto the carrier substrate through a roller, a locally strong pressure is applied onto the stretchable substrate with a thin thickness by the roller, and thus the stretchable substrate may be subjected to a geometrical deformation. However, the combining through air pressure according to one embodiment of the present invention, the air flowing in through the air inlet 1250 may provide a uniform pressure onto an entire surface of the stretchable substrate (SS), thereby minimizing the deformation of the stretchable substrate (SS).

Further, the carrier substrate (CS) is formed of a material harder than that of the stretchable substrate (SS) as described above. In this case, the stretchable substrate (SS) of a soft material moves toward the carrier substrate (CS) by the diaphragm 1300 in a state in which the carrier substrate (CS) of a hard material is located in a fixed way. Thus, the stretchable substrate (SS) of the soft material may be deformed depending on the surface and shape of the carrier substrate (CS) of the hard material, thereby enhancing a combining property.

Further, the stretchable substrate (SS) is combined onto the carrier substrate (CS) and a size of the stretchable substrate (SS) is larger than that of the carrier substrate (CS), and thus the stretchable substrate (SS) may cover at least a part of a side of the carrier substrate (CS). As a result, the stretchable substrate (SS) may be combined onto an entire surface of the carrier substrate (CS) (for example, XY plane) while covering such surface completely.

As a result, the stretchable substrate structure may be manufactured in such a way that the stretchable substrate (SS) is combined onto the carrier substrate (CS).

With regard to the stretchable substrate structure manufactured above, the stretchable substrate (SS) formed in a region outside the carrier substrate (CS) may be removed therefrom in a follow-up process. As described above, the stretchable substrate (SS) is formed of a material softer than that of the carrier substrate (CS), and thus it may be easy to cut off the region outside the stretchable substrate (SS).

Further, the carrier substrate (CS) may be removed from the stretchable substrate structure by a follow-up process. For example, the stretchable substrate structure may be manufactured and then may be removed from the carrier substrate (CS). Alternatively, various driving elements, for example, driving elements for display may be formed on the stretchable substrate (SS) of the stretchable substrate structure, and then the carrier substrate (CS) may be removed therefrom.

In this case, a process for removing the carrier substrate (CS) from the stretchable substrate structure may be different depending on the types of the adhesive for combining the stretchable substrate (SS) and the carrier substrate (CS). For example, when the carrier substrate (CS) and the stretchable substrate (SS) are combined with a double-sided tape that loses the adhesive strength at −30° C. or less, a low temperature environment may be provided to remove the carrier substrate (CS) therefrom. As another example, ultraviolet rays of 380 nm or less may be irradiated to remove the carrier substrate (CS) therefrom according to adhesive types.

The device for manufacturing the stretchable substrate structure and the method for manufacturing the stretchable substrate structure according to one embodiment of the present invention have been described above. According to one embodiment, the carrier substrate and the stretchable substrate are combined to each other by air pressure and the stretchable substrate of a soft material moves in a direction of the carrier substrate, and thus combining is performed. Further, a pressure is reduced on the periphery of the carrier substrate through the air outlet and the pressure is raised on the periphery of the diaphragm through the air inlet, thereby allowing the diaphragm to combine the stretchable substrate onto the carrier substrate through air pressure.

As a result, since the air pressure serves as the driving force for combining, such air pressure may push the stretchable substrate in a direction of the carrier substrate by a uniform strength across the entire surface of the stretchable substrate, and thus may minimize damage to be applied onto the stretchable substrate with a thin thickness.

As described above, the device for manufacturing the stretchable substrate structure and the method for manufacturing the stretchable substrate structure according to one embodiment of the present invention may be applied to the stretchable electronic equipment, for example, stretchable displays and stretchable solar cell fields, too. The listed examples of application are provided only for illustration and such device and method may be applied to more stretchable electronic equipment fields.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

The invention claimed is:

1. A method for manufacturing a stretchable substrate, the method comprising:
providing a first solution, which has a first modulus after curing, onto a carrier substrate;
providing a second solution, which has a second modulus different from the first modulus after curing, onto the carrier substrate; and
curing the first solution and the second solution,
wherein a mixed solution of the first solution and the second solution is formed by the providing of the second solution, and the mixed solution provides an interface modulus gradually changing between the first modulus and the second modulus after the curing, and
wherein the interface modulus gradually changes between the first modulus and the second modulus in a plane direction of the carrier substrate and is constant in a thickness direction of the carrier substrate.

2. A method for manufacturing a stretchable substrate, the method comprising:
providing a first solution, which has a first modulus after curing, onto a carrier substrate;
pre-curing the first solution;
providing a second solution, which has a second modulus different from the first modulus after curing, onto the carrier substrate; and
mainly curing the pre-cured first solution and the second solution,
wherein a mixed solution of the pre-cured first solution and the second solution is formed by the providing of the second solution, and the mixed solution provides an interface modulus gradually changing between the first modulus and the second modulus after the main-curing.

3. The method of claim 1, wherein the providing of the second solution is performed after the providing of the first solution, and the first modulus is smaller than the second modulus.

4. The method of claim 3, wherein the first solution and the second solution comprise liquid silicon rubber, and the second solution comprises a curing agent more than a curing agent of the first solution.

5. The method of claim 1, wherein the first solution is provided onto an entire surface of the carrier substrate in the providing of the first solution, and the second solution is provided locally onto a predetermined region in the providing of the second solution.

6. The method of claim 1, wherein at least one of the first solution and the second solution comprises a visually distinguishable coloring agent.

7. The method of claim 2, wherein the interface modulus gradually changes between the first modulus and the second modulus in a plane direction of the carrier substrate and is constant in a thickness direction of the carrier substrate.

8. The method of claim 2, wherein the pre-curing of the first solution is performed within a range in which the second solution, which is provided in the providing of the second solution, is absorbed into the pre-cured first solution.

* * * * *